(12) United States Patent
Schwarz et al.

(10) Patent No.: US 10,916,686 B2
(45) Date of Patent: Feb. 9, 2021

(54) OPTOELECTRONIC COMPONENT, OPTOELECTRONIC ARRANGEMENT, METHOD OF PRODUCING AN OPTICAL ELEMENT, AND METHOD OF PRODUCING AN OPTOELECTRONIC COMPONENT

(71) Applicant: OSRAM Opto Semiconductors GmbH, Regensburg (DE)

(72) Inventors: Thomas Schwarz, Regensburg (DE); Frank Singer, Regenstauf (DE); Alexander Linkov, Regensburg (DE); Stefan Illek, Donaustauf (DE); Wolfgang Moench, Pentling (DE)

(73) Assignee: OSRAM OLED GmbH, Regensburg (DE)

( * ) Notice: Subject to any disclaimer, the term of this patent is extended or adjusted under 35 U.S.C. 154(b) by 342 days.

(21) Appl. No.: 15/033,664

(22) PCT Filed: Nov. 4, 2014

(86) PCT No.: PCT/EP2014/073730
§ 371 (c)(1),
(2) Date: May 2, 2016

(87) PCT Pub. No.: WO2015/067612
PCT Pub. Date: May 14, 2015

(65) Prior Publication Data
US 2016/0276556 A1 Sep. 22, 2016

(30) Foreign Application Priority Data
Nov. 8, 2013 (DE) .......................... 10 2013 222 702

(51) Int. Cl.
*H01L 33/58* (2010.01)

(52) U.S. Cl.
CPC ...... *H01L 33/58* (2013.01); *H01L 2933/0058* (2013.01); *H01L 2933/0091* (2013.01)

(58) Field of Classification Search
CPC ............. H01L 33/58; H01L 2933/0041; H01L 2933/005; H01L 2933/0091
(Continued)

(56) References Cited

U.S. PATENT DOCUMENTS

| 8,754,435 | B1 * | 6/2014 | Tischler | ................ H01L 33/508 257/98 |
| 9,041,014 | B2 * | 5/2015 | Maute | ..................... H01L 33/44 257/79 |

(Continued)

FOREIGN PATENT DOCUMENTS

| CN | 101344234 | 1/2009 |
| CN | 101795860 | 8/2010 |

(Continued)

OTHER PUBLICATIONS

First Office Action dated Aug. 29, 2017, of corresponding Chinese Application No. 201480060976.6 in English.

(Continued)

*Primary Examiner* — Monica D Harrison
(74) *Attorney, Agent, or Firm* — DLA Piper LLP (US)

(57) ABSTRACT

An optoelectronic component includes an optoelectronic semiconductor chip having a radiation-emitting face; and an optical element arranged over the radiation-emitting face, wherein the optical element includes a material in which light-scattering particles are embedded, and a concentration of the embedded light-scattering particles has a gradient forming an angle not equal to 90° with the radiation emission face.

7 Claims, 4 Drawing Sheets

(58) Field of Classification Search
USPC .......................................................... 257/98
See application file for complete search history.

(56) References Cited

U.S. PATENT DOCUMENTS

| | | | |
|---|---|---|---|
| 9,362,470 B2* | 6/2016 | Schmidtke | H01L 31/18 |
| 2006/0066218 A1 | 3/2006 | Yamaguchi et al. | |
| 2006/0208269 A1 | 9/2006 | Kim et al. | |
| 2006/0220046 A1 | 10/2006 | Yu et al. | |
| 2008/0044564 A1 | 2/2008 | Kanade et al. | |
| 2009/0273931 A1 | 11/2009 | Ito et al. | |
| 2010/0103660 A1 | 4/2010 | van De Ven et al. | |
| 2010/0326519 A1 | 12/2010 | Tanase et al. | |
| 2011/0001151 A1 | 1/2011 | Le Toquin | |
| 2011/0127552 A1 | 6/2011 | Van Herpen et al. | |
| 2011/0133237 A1 | 6/2011 | Koike et al. | |
| 2012/0248479 A1 | 10/2012 | Anc | |
| 2012/0286314 A1 | 11/2012 | Shinohara et al. | |
| 2013/0039617 A1 | 2/2013 | Illek et al. | |
| 2013/0223101 A1 | 8/2013 | Iwasaki | |

FOREIGN PATENT DOCUMENTS

| | | |
|---|---|---|
| CN | 101960919 | 1/2011 |
| CN | 102473822 | 5/2012 |
| DE | 10 2009 018 088 A1 | 12/2009 |
| JP | 2007-273090 | 7/1918 |
| JP | 06-324330 | 11/1994 |
| JP | 11-194204 | 7/1999 |
| JP | 2000-019308 | 1/2000 |
| JP | 2002-107513 | 4/2002 |
| JP | 2005-148186 | 6/2005 |
| JP | 2006-92983 | 4/2006 |
| JP | 2006-199028 | 8/2006 |
| JP | 2006-261663 | 9/2006 |
| JP | 2007-180339 | 7/2007 |
| JP | 2009-016289 | 1/2009 |
| JP | 2009-223298 | 10/2009 |
| JP | 2009-538454 | 11/2009 |
| JP | 2010-0003941 | 1/2010 |
| JP | 2012-104468 | 5/2012 |
| JP | 2013-527605 | 6/2013 |
| JP | 2013-157326 | 8/2013 |
| WO | 2007/105671 | 9/2007 |
| WO | 2008/043519 | 4/2008 |
| WO | 2008/087883 | 7/2008 |
| WO | 2014/028019 A1 | 2/2014 |

OTHER PUBLICATIONS

Notice of Reasons for Rejection dated May 23, 2017, of corresponding Japanese Application No. 2016-551026 in English.
Second Office Action dated Apr. 11, 2018, of corresponding Chinese Application No. 201480060976.6, along with an English translation.

* cited by examiner

OPTOELECTRONIC COMPONENT, OPTOELECTRONIC ARRANGEMENT, METHOD OF PRODUCING AN OPTICAL ELEMENT, AND METHOD OF PRODUCING AN OPTOELECTRONIC COMPONENT

TECHNICAL FIELD

This disclosure relates to an optoelectronic component, an optoelectronic arrangement, a method of producing an optical element and a method of producing an optoelectronic component.

BACKGROUND

Optoelectronic components, for example, light-emitting diode components configured to emit electromagnetic radiation laterally are known. It is known to use such optoelectronic components, for example, for backlighting of liquid-crystal displays. In this case, the optoelectronic components are arranged such that the radiation emitted by them is shone sideways into a light guide. The optical parts, required for lateral deviation of the radiation, of known optoelectronic components limit the possibilities of reducing a thickness of such known arrangements.

SUMMARY

We provide an optoelectronic component including an optoelectronic semiconductor chip having a radiation emission face, and an optical element arranged over the radiation emission face, wherein the optical element includes a material in which light-scattering particles are embedded, and a concentration of the embedded light-scattering particles has a gradient forming an angle not equal to 90° with the radiation emission face.

We also provide an optoelectronic arrangement including the optoelectronic component including an optoelectronic semiconductor chip having a radiation emission face, and an optical element arranged over the radiation emission face, wherein the optical element includes a material in which light-scattering particles are embedded, and a concentration of the embedded light-scattering particles has a gradient forming an angle not equal to 90° with the radiation emission face, and a light guide, wherein the light guide is arranged laterally next to the optical element.

We further provide a method of producing an optical element including forming a block of a material with embedded light-scattering particles, a concentration of the embedded light-scattering particles having a gradient, and dividing the block to obtain an optical element with a lower side, the gradient forming an angle not equal to 90° with the lower side.

We also further provide a method of producing an optoelectronic component including producing an optical element by the method of producing an optical element including forming a block of a material with embedded light-scattering particles, a concentration of the embedded light-scattering particles having a gradient, and dividing the block to obtain an optical element with a lower side, the gradient forming an angle not equal to 90° with the lower side, providing an optoelectronic semiconductor chip having a radiation emission face, and arranging the optical element over the radiation emission face.

LIST OF REFERENCES 100 optoelectronic arrangement
110 light guide
111 light guide direction
200 optoelectronic component
210 optoelectronic semiconductor chip
211 radiation emission face
300 optical element
301 upper side
302 lower side
303 thickness
304 first side face
305 second side face
310 matrix
320 light-scattering particle
321 average size
330 concentration gradient
331 angle
400 first block
401 upper side
402 lower side
410 layer
500 second block
501 upper side
502 lower side
510 first sublayer
520 second sublayer
530 third sublayer
540 fourth sublayer
600 third block
601 upper side
602 lower side
610 first sublayer
620 second sublayer
630 third sublayer
640 fourth sublayer
650 extrusion die

DETAILED DESCRIPTION

Our optoelectronic component comprises an optoelectronic semiconductor chip with a radiation emission face. An optical element is arranged over the radiation emission face. The optical element comprises a material in which light-scattering particles are embedded. A concentration of the embedded light-scattering particles has a gradient making an angle not equal to 90° with the radiation emission face.

Advantageously, the effect of the inclined concentration gradient of the light-scattering particles embedded in the material of the optical element of this optoelectronic component is lateral deviation of electromagnetic radiation emitted by the optoelectronic semiconductor chip of the optoelectronic component at its radiation emission face. The optoelectronic component is therefore advantageously suitable for coupling electromagnetic radiation into a light guide arranged laterally next to the optoelectronic component and oriented parallel to the radiation emission face of the optoelectronic semiconductor chip. Owing to the lateral deviation of the electromagnetic radiation emitted by the optoelectronic semiconductor chip, it is not necessary to turn the radiation emission face of the optoelectronic semiconductor chip toward the light guide. This makes it possible to arrange the optoelectronic semiconductor chip of the optoelectronic component flat on a carrier, which allows good thermal connection of the optoelectronic semiconductor chip of the optoelectronic component. Furthermore, the optoelectronic component may therefore, for example, be configured as a surface-mountable SMD component, which allows simple and economical mounting of the optoelectronic component.

The angle may be 35° to 55°. Preferably, the angle is 40° to 50°. For example, the angle may be about 45°. The effect advantageously achieved by this is that electromagnetic radiation emitted at the radiation emission face of the optoelectronic semiconductor chip of the optoelectronic component in a direction perpendicular to the radiation emission face is deviated approximately through a right angle by the optical element.

The material may comprise a silicone, a polycarbonate or a glass. Advantageously, the material therefore forms an optically essentially transparent matrix which carries the embedded light-scattering particles.

The light-scattering particles may have an average size of 200 nm to 50 µm. Advantageously, the light-scattering particles therefore cause effective scattering of electromagnetic radiation emitted by the optoelectronic semiconductor chip.

The light-scattering particles may comprise $TiO_2$, $Al_2O_3$, $Hf_2O_5$ or $SiO_2$. Advantageously, the light-scattering particles therefore cause effective scattering of electromagnetic radiation emitted by the optoelectronic semiconductor chip.

The optical element may have a thickness over the radiation emission face, in a direction perpendicular to the radiation emission face, of 0.1 mm to 1 mm. Preferably, the optical element has a thickness of less than 0.3 mm. This advantageously makes it possible to configure the optoelectronic component with a very small thickness (height) overall. The small thickness of the optical element furthermore makes it possible to couple electromagnetic radiation emitted by the optoelectronic semiconductor chip of the optoelectronic component into a light guide with a small thickness.

Wavelength-converting particles may additionally be coupled in the material of the optical element. The wavelength-converting particles may, for example, be configured as an organic luminescent material or an inorganic luminescent material. The wavelength-converting particles may also comprise quantum dots. The wavelength-converting particles embedded in the material of the optical element may be used to convert a wavelength of electromagnetic radiation emitted by the optoelectronic semiconductor chip of the optoelectronic component. The optoelectronic semiconductor chip may, for example, be configured to emit electromagnetic radiation with a wavelength in the blue spectral range. The wavelength-converting particles may, for example, be configured to convert electromagnetic radiation with a wavelength in the blue spectral range into electromagnetic radiation with a white spectral distribution.

An optoelectronic arrangement comprises an optoelectronic component of the type mentioned above and a light guide. The light guide is arranged laterally next to the optical element. Advantageously, the optoelectronic component of the optoelectronic arrangement may couple electromagnetic radiation, for example, visible light into the light guide. The optoelectronic arrangement is therefore suitable, for example, for background lighting in a liquid-crystal display. Advantageously, the optoelectronic arrangement may be configured to be very thin in a direction perpendicular to the radiation emission face of the optoelectronic semiconductor chip.

The light guide may be oriented parallel to the radiation emission face. Advantageously, electromagnetic radiation deviated in the optical element of the optoelectronic component of the optoelectronic arrangement can be coupled into the light guide and transported by the light guide.

Our method of producing an optical element comprises steps of forming a block of a material with embedded light-scattering particles, a concentration of the embedded light-scattering particles having a gradient, and dividing the block to obtain an optical element with a lower side, the gradient making an angle not equal to 90° with the lower side. The optical element can be obtained by this method allows deviation of electromagnetic radiation entering the optical element at the lower side in a direction perpendicular to the lower side. Advantageously, the method allows simple and economical production of the optical element.

To form the block, steps may be carried out of providing a layer of the material with embedded light-scattering particles, allowing the light-scattering particles to sink in the material so that the concentration gradient is formed, and curing the material of the layer to form the block. Advantageously, this method allows particularly simple and economical formation of the block with embedded light-scattering particles, the concentration of which has a gradient. In this case, the force of gravity is advantageously used to form the gradient.

To form the block, steps may be carried out of providing a first layer of the material and a second layer of the material, the first layer having a first concentration of embedded light-scattering particles and the second layer having a second concentration of embedded light-scattering particles, and flat bonding the first layer and the second layer to form the block. Advantageously, this method allows particularly accurate control of the configuration of the concentration gradient of the light-scattering particles embedded in the material of the block. The flat bonding of the first layer and the second layer may, for example, be carried out by adhesive bonding of the layers by an adhesive. Alternatively, the first layer and the second layer may be bonded to one another before the materials of the first layer and of the second layer are fully cured. This can make it possible to avoid the use of a separate adhesive.

To form the block, a step may be carried out of coextruding a first layer of the material and a second layer of the material, the first layer having a first concentration of embedded light-scattering particles and the second layer having a second concentration of embedded light-scattering particles, the first layer and the second layer being coextruded while lying on one another to form the block. Advantageously, this method also allows accurate control of the configuration of the concentration gradient of the light-scattering particles embedded in the material of the block. Owing to coextrusion of the layers forming the block, subsequent bonding of the layers is advantageously not necessary.

The block may be formed from more than two layers. Advantageously, configuration of the concentration gradient of the light-scattering particles embedded in the material of the block can therefore be modeled particularly finely.

Our method of producing an optoelectronic component comprises steps of producing an optical element by a method of the type mentioned above, providing an optoelectronic semiconductor chip having a radiation emission face, and arranging the optical element over the radiation emission face. Advantageously, this allows simple and economical production of the optoelectronic component. The optical element of the optoelectronic component which can be obtained by this method can advantageously deviate electromagnetic radiation emitted by the optoelectronic semiconductor chip of the optoelectronic component.

The above-described properties, features and advantages, as well as the way in which they are achieved, will become more clearly and comprehensively understandable in connection with the following description of examples, which will be explained in more detail in connection with the drawings.

Figure 1:
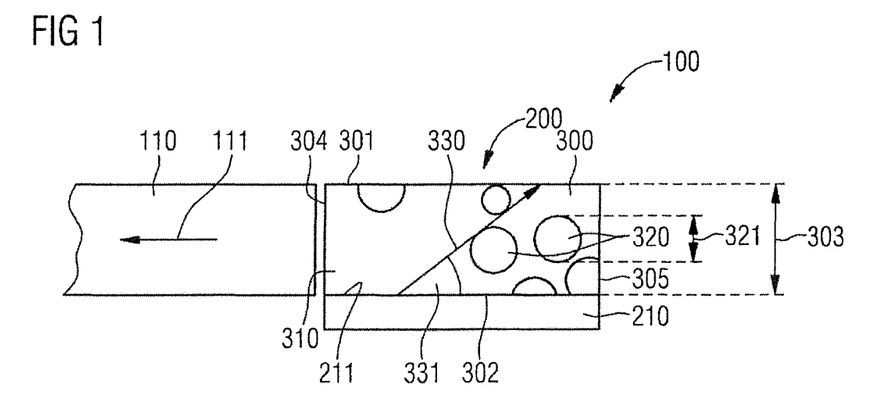
FIG. 1 shows a sectional side view of an optoelectronic arrangement.

FIG. 1 shows a schematic sectional side view of an optoelectronic arrangement 100. The optoelectronic arrangement 100 may, for example, be used for background lighting in a liquid-crystal display (LCD). For example, the optoelectronic arrangement 100 may be used for background lighting in a liquid-crystal display of a portable electronic device, for instance a cellphone.

The optoelectronic arrangement 100 comprises an optoelectronic component 200. The optoelectronic component 200 is used to generate and guide electromagnetic radiation, in particular visible light.

The optoelectronic component 200 comprises an optoelectronic semiconductor chip 210. The optoelectronic semiconductor chip 210 has a radiation emission face 211. The optoelectronic semiconductor chip 210 is configured to emit electromagnetic radiation, for example, visible light at its radiation emission face 211. The optoelectronic semiconductor chip 210 may, for example, be configured as a light-emitting diode chip (LED chip).

Solder contact pads of the optoelectronic semiconductor chip 210 may be formed on one of the lower sides, opposite the radiation emission face 211, of the optoelectronic semiconductor chip 210. In this case, the optoelectronic component 200 may be configured as an SMD component suitable for surface mounting. The solder contact pads arranged on the lower side of the optoelectronic semiconductor chip 210 may, for example, be provided for electrical contacting by reflow soldering.

The optoelectronic component 200 furthermore comprises an optical element 300. The optical element 300 is essentially configured with a cuboid shape and has an upper side 301 and a lower side 302 opposite the upper side 301. The optical element 300 furthermore has a first side face 304 and a second side face 305 opposite the first side face 304. The first side face 304 and the second side face 305 are respectively oriented perpendicularly to the upper side 301 and to the lower side 302 of the optical element 300.

Between the upper side 301 and the lower side 302, the optical element 300 has a thickness 303 measured perpendicularly to the lower side 302. The thickness 303 of the optical element 300 preferably is 0.1 mm to 1 mm. Particularly preferably, the thickness 303 of the optical element 300 is less than 0.3 mm.

The optical element 300 is arranged over the radiation emission face 211 of the optoelectronic semiconductor chip 210. In this case, the lower side 302 of the optical element 300 faces toward the radiation emission face 211 and is preferably in contact therewith. The size of the lower side 302 of the optical element 300 preferably corresponds approximately to the size of the radiation emission face 211 of the optoelectronic semiconductor chip 210. Electromagnetic radiation emitted at the radiation emission face 211 of the optoelectronic semiconductor chip 210 can pass through the lower side 302 into the optical element 300.

The optical element 300 has a matrix 310 made of an optically essentially transparent material. For example, the matrix 310 of the optical element 300 may comprise a silicone, polycarbonate or a glass. Light-scattering particles 320 are embedded in the matrix 310 of the optical element 300. The light-scattering particles 320 may, for example, comprise $TiO_2$, $Al_2O_3$, $Hf_2O_5$ or $SiO_2$. The light-scattering particles 320 have an average size 321, which is represented very exaggeratedly in the schematic view of FIG. 1. The average size 321 of the light-scattering particles 320 may, for example, be 200 nm to 50 μm.

The light-scattering particles 320 are not distributed homogeneously in the matrix 310 of the optical element 300. Instead, a concentration of the light-scattering particles 320 embedded in the matrix 310 of the optical element 300 has a concentration gradient 330, along which the concentration of the light-scattering particles 320 embedded in the matrix 310 increases. The concentration gradient 330 makes an angle 331 with the lower side 302 of the optical element 300. The concentration gradient 330 is therefore also arranged at the angle 331 relative to the radiation emission face 211 of the optoelectronic semiconductor chip 210. The angle 331 has a value not equal to 90°. The concentration gradient 330 is therefore not perpendicular to the lower side 302 of the optical element 300 and the radiation emission face 211 of the optoelectronic semiconductor chip 210. Preferably, the angle 331 has a value of 35° to 55°. Particularly preferably, the angle 331 has a value of 40° to 50°. For example, the angle 331 may have a value of 45°.

Because of the increase in the concentration of the light-scattering particles 320 embedded in the matrix 310 along the concentration gradient 330, the light-scattering particles 320 embedded in the matrix 310 have a lower concentration in a first subregion of the optical element 300, arranged close to the lower side 302 and the first side face 304, than in a second subregion of the optical element 300, arranged close to the upper side 301 and the second side face 305 of the optical element 300. In the first subregion of the optical element 300, the concentration of the light-scattering particles 320 embedded in the matrix 310 may, for example, be 0°. In the second subregion of the optical element 300, the concentration of the light-scattering particles 320 may, for example, be 25°.

The concentration of the light-scattering particles 320 embedded in the matrix 310 of the optical element 300 may increase continuously along the concentration gradient 330. The concentration of the light-scattering particles 320 may, however, also increase in steps along the concentration gradient 330. In this case, a higher number of steps is preferred to a lower number of steps.

The concentration gradient 330 of the light-scattering particles 320 embedded in the matrix 310 of the optical element 300 causes deviation of electromagnetic radiation entering the optical element 300 at the lower side 302. The deviation takes place by scattering of the electromagnetic radiation at the light-scattering particles 320. In this case, the electromagnetic radiation is deviated counter to the concentration gradient 330. Electromagnetic radiation entering the optical element 300 at the lower side 302 of the optical element 300, essentially in a direction perpendicular to the lower side 302, is therefore deviated in the optical element 300 in the direction of the first side face 304. A large part of the radiation entering the optical element 300 at the lower side 302 of the optical element 300 can therefore leave the optical element 300 through the first side face 304 in a direction oriented essentially perpendicular to the first side face 304. A part of radiation entering the optical element 300 at the lower side 302 leaves the optical element 300 at other surfaces of the optical element 300.

Besides the optoelectronic component 200, the optoelectronic arrangement 100 comprises a light guide 110. The light guide 110 may, for example, be configured as a flat light guide. The light guide 110 is arranged next to the optoelectronic component 200 such that electromagnetic radiation emerging at the first side face 304 of the optical element 300 of the optoelectronic component 200 can enter the light guide 110 and be guided further by the light guide 110 in a light guide direction 111 essentially oriented parallel to the radiation emission face 211 of the optical semiconductor chip 210 of the optoelectronic component 200 of the optoelectronic arrangement 100. The electromagnetic radiation guided further in the light guide 110 may, for example, be used for background lighting of a liquid-crystal display. In a direction perpendicular to the light guide direction 111, the light guide 110 preferably has a thickness corresponding approximately to the thickness 303 of the optical element 300.

Besides the light-scattering particles 320, wavelength-converting particles may also be embedded in the matrix 310 of the optical element 300. The wavelength-converting particles may, for example, comprise an organic or inorganic luminescent material. The wavelength-converting particles may also comprise quantum dots. The wavelength-converting particles may be provided to convert a wavelength of electromagnetic radiation emitted by the optoelectronic semiconductor chip 210 of the optoelectronic component 200. To this end, the wavelength-converting particles may be configured to absorb electromagnetic radiation with a first wavelength and subsequently emit electromagnetic radiation with a second, typically longer, wavelength. The wavelength-converting particles embedded in the matrix 310 of the optical element 300 may, for example, be provided to convert electromagnetic radiation emitted by the optoelectronic semiconductor chip 210 with a wavelength in the blue spectral range into electromagnetic radiation with a white spectral distribution. Embedding of wavelength-converting particles in the matrix 310 of the optical element 300 may, however, also be omitted.

Variants of a method of producing the optical element 300 of the optoelectronic component 200 of the optoelectronic arrangement 100 will be described below with the aid of FIGS. 2 to 4 and 5 to 6 and 7 to 8. Parts corresponding to one another are provided with the same references in all the figures as in FIG. 1 and will not be described in detail again.

Figure 2:
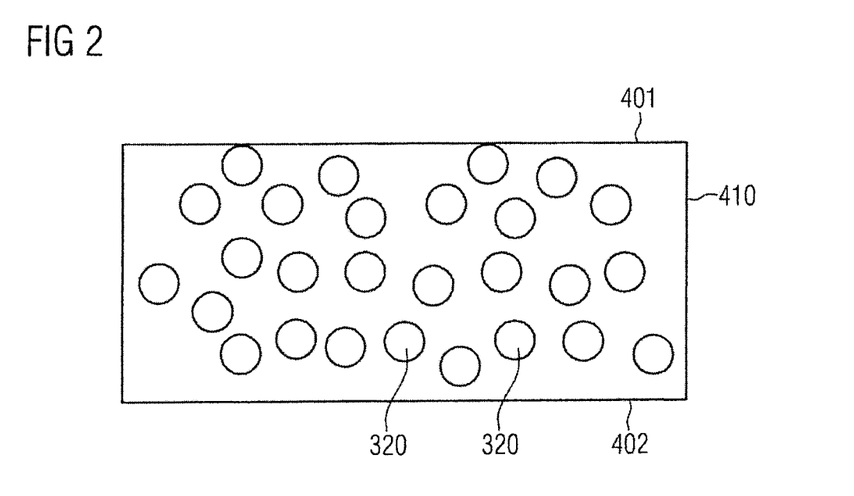
FIG. 2 shows a sectional side view of a layer of a material with embedded light-scattering particles.

FIG. 2 shows a schematically sectional side view of a layer 410. The layer 410 has an upper side 401 and a lower side 402 opposite the upper side 401. The layer 410 comprises a material corresponding to the material of the matrix 310 of the optical element 300, or from which the material of the matrix 310 of the optical element 300 can be formed. The material of the layer 410 is not fully cured.

Light-scattering particles 320 are embedded in the layer 410. The light-scattering particles may be distributed essentially homogeneously in the layer 410. The light-scattering particles 320 embedded in the layer 410 may thus essentially have a homogeneous concentration.

Since the material of the layer 410 is not fully cured, the light-scattering particles 320 embedded in the layer 410 can sink in the layer 410 under the effect of the force of gravity in the direction of the lower side 402 of the layer 410. This is represented in the schematic sectional side view of FIG. 3. Because of the sinking which progresses over time of the light-scattering particles 320 embedded in the layer 410, a concentration gradient 330 of the concentration of the light-scattering particles 320 embedded in the layer 410 is formed in the layer 410. The concentration gradient 330 points from the upper side 401 to the lower side 402 of the layer 410 and is oriented essentially perpendicularly to the upper side 401 and lower side 402 of the layer 410.

Figure 3:
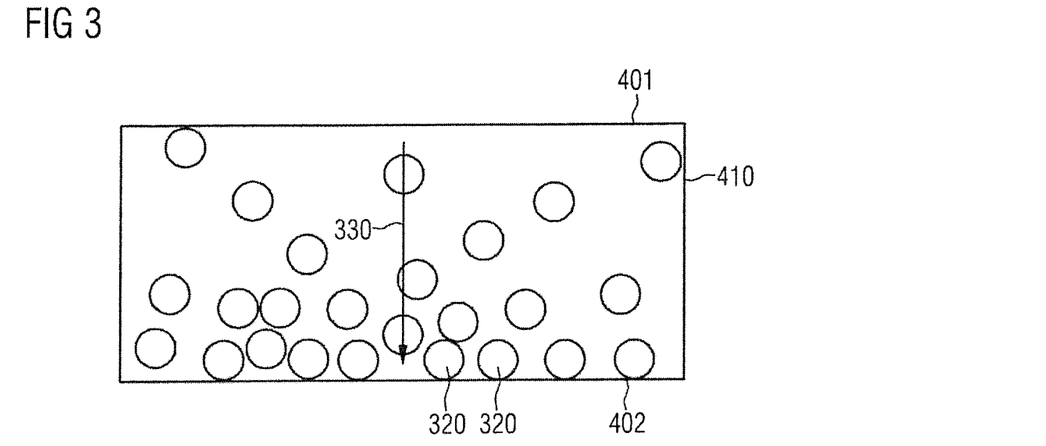
FIG. 3 shows a sectional side view of the layer after the sinking of the light-scattering particles.

As soon as the concentration gradient 330 of the light-scattering particles 320 embedded in the layer 410 has been formed to a desired extent, the material of the layer 410 may be cured. Curing the material of the layer 410 may, for example, be carried out by a heat treatment or a treatment with UV light.

Figure 4:
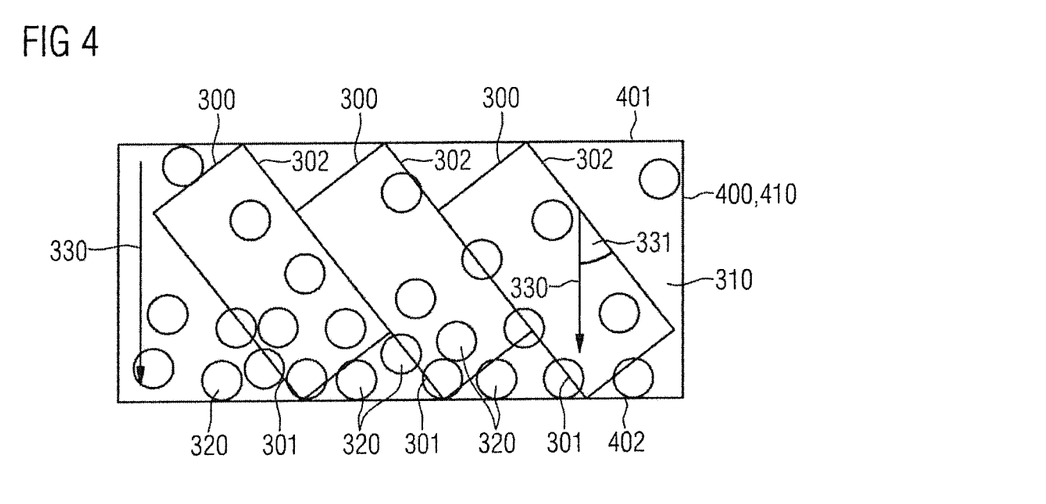
FIG. 4 shows a sectional side view of a block formed from the layer for producing a multiplicity of optical elements.

Further sinking of the light-scattering particles 320 in the material of the layer 410 is prevented by the curing the material of the layer 410. The light-scattering particles 320 are fixed in the material of the layer 410. A first block 400 is therefore formed from the layer 410 by curing the material of the layer 410. The cured material of the layer 410 forms a matrix 310 of the first block 400. The light-scattering particles 320 embedded in the matrix 310 of the first block 400 have a concentration in the matrix 310 increasing along the concentration gradient 330. The concentration gradient 330 is oriented essentially perpendicularly to the upper side 401 and the lower side 402 of the layer 410 forming an upper side and a lower side of the first block 400. FIG. 4 shows a schematic sectional side view of the first block 400.

In a subsequent processing step, the first block 400 may be divided to obtain a multiplicity of optical elements 300. Division of the first block 400 may, for example, be carried out by cutting the first block 400. The first block 400 is divided such that the lower sides 302 of the optical elements formed make an angle not equal to 90° with the concentration gradient 330. The optical elements 300 are thus separated, for example, cut out obliquely from the first block 400.

Figure 5:
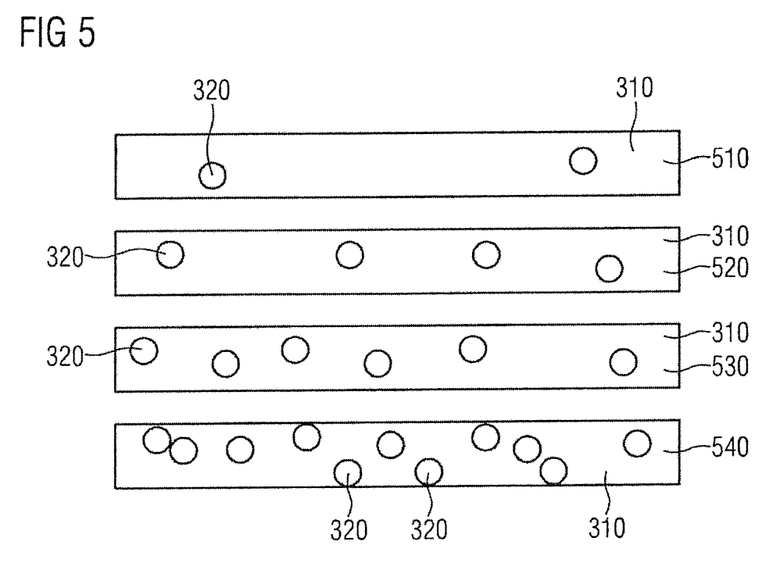
FIG. 5 shows a multiplicity of sublayers for producing a block.

FIG. 5 shows a schematic sectional side view of a first sublayer 510, a second sublayer 520, a third sublayer 530 and a fourth sublayer 540. The sublayers 510, 520, 530, 540 are configured in the form of thin sheets. In this case, the sublayers 510, 520, 530, 540 have established thicknesses. The thicknesses of the individual sublayers 510, 520, 530, 540 may correspond to one another or differ from one another.

Each of the sublayers 510, 520, 530, 540 comprises a material corresponding to the material of the matrix 310 of the optical element 300. Light-scattering particles 320 are embedded in each of the sublayers 510, 520, 530, 540. The light-scattering particles 320 embedded in the material of the first sublayer 510 have a first concentration. The light-scattering particles 320 embedded in the material of the second sublayer 520 have a second concentration. The light-scattering particles 320 embedded in the material of the third sublayer 530 have a third concentration. The light-scattering particles 320 embedded in the material of the fourth sublayer 540 have a fourth concentration. Within the sublayers 510, 520, 530, 540, the concentration of the light-scattering particles 320 is respectively essentially constant. The second concentration of the light-scattering particles 320 is, however, greater than the first concentration of the light-scattering particles 320. The third concentration is in turn greater than the second concentration. The fourth concentration is greater than the third concentration.

Figure 6:
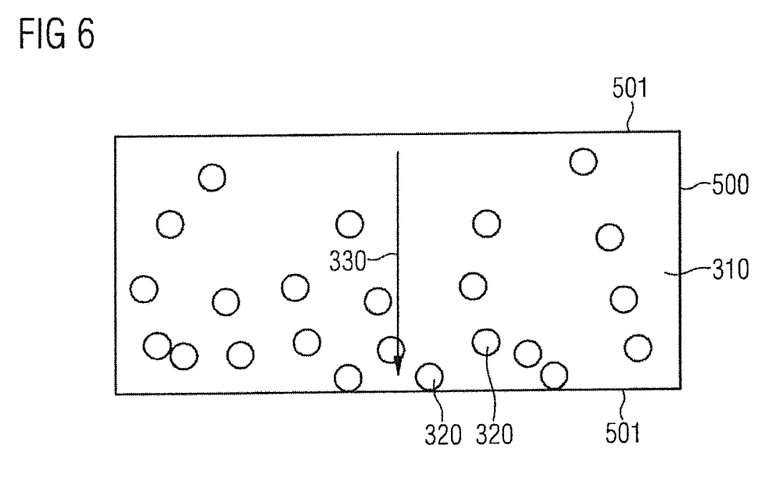
FIG. 6 shows a sectional side view of a block formed from the sublayers.

The sublayers 510, 520, 530, 540 may be bonded flatly to one another to form a second block 500. In this case, the second sublayer 520 is arranged between the first sublayer 510 and the third sublayer 530. The third sublayer 530 is arranged between the second sublayer 520 and the fourth sublayer 540. An upper side of the first sublayer 510 forms an upper side 501 of the second block 500. A lower side of the fourth sublayer 540 forms a lower side 502 of the second block 500.

Of course, the second block 500 may also be formed from more than four sublayers 510, 520, 530, 540. In this case, the individual sublayers preferably have respectively increasing concentrations of embedded light-scattering particles 320 in the order in which they are bonded to one another. It is, however, also possible to form the second block 500 from merely two sublayers 510, 520 or from three sublayers 510, 520, 530.

Bonding the sublayers 510, 520, 530, 540 to form the second block 500 may, for example, be carried out by lamination of the sublayers 510, 520, 530, 540. In this case, the individual sublayers 510, 520, 530, 540 may, for example, be bonded flatly to one another by a separate adhesive. In this case, the material, comprising the embedded light-scattering particles 320, of the sublayers 510, 520, 530, 540 may already be fully cured before the bonding of the sublayers 510, 520, 530, 540.

The sublayers 510, 520, 530, 540 may, however, also be bonded to one another to form the second block 500 without using a separate adhesive. In this case, the material, comprising the embedded light-scattering particles 320, of the sublayers 510, 520, 530, 540 is not yet fully cured during the bonding of the sublayers 510, 520, 530, 540 and, therefore, allows permanent bonding of the sublayers 510, 520, 530, 540. After the bonding of the sublayers 510, 520, 530, 540, the material, comprising the embedded light-scattering particles 320, of the sublayers 510, 520, 530, 540 may be cured, for example, by a heat treatment or a treatment with UV light.

FIG. 6 shows a schematic sectional side view of the second block 500 formed from the sublayers 510, 520, 530, 540. The material of the sublayers 510, 520, 530, 540 bonded to one another forms a matrix 310, in which the light-scattering particles 320 are embedded, of the second block 500. In the second block 500, the embedded light-scattering particles 320 have a concentration gradient 330 pointing from the upper side 501 of the second block 500 to the lower side 502 of the second block 500 and is essentially oriented perpendicularly to the upper side 501 and to the lower side 502. Along the concentration gradient 330, the concentration of the light-scattering particles 320 embedded in the matrix 310 of the second block 500 increases in steps.

In a subsequent processing step, optical elements 300 may be formed from the second block 500 by dividing the latter in a way similar to the division, explained with the aid of FIG. 4, of the first block 400.

Figure 7:
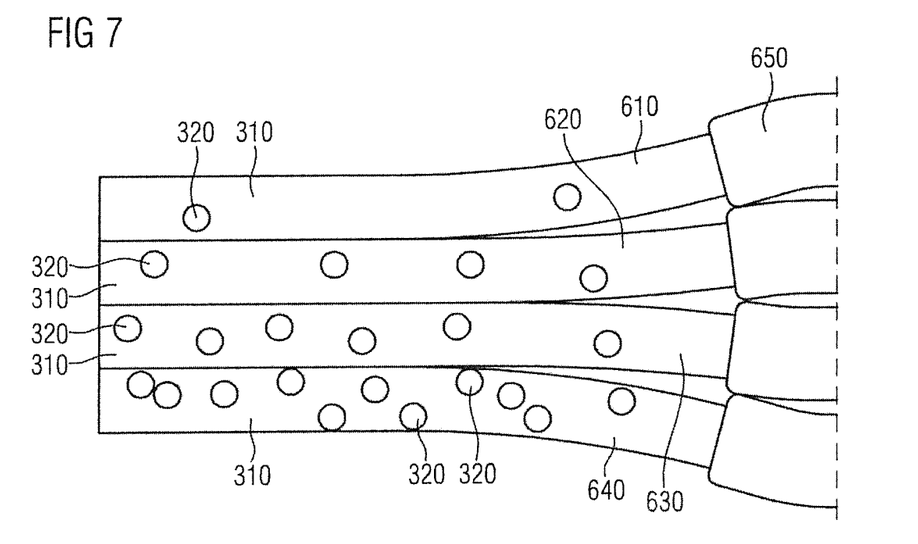
FIG. 7 shows a sectional side view of a multiplicity of coextruded sublayers for producing a block.

FIG. 7 shows a schematic sectional side view of a first sublayer 610, a second sublayer 620, a third sublayer 630 and a fourth sublayer 640. The sublayers 610, 620, 630, 640 are formed in the form of thin sheets by coextrusion by an extrusion die 650. Each of the sublayers 610, 620, 630, 640 has an established thickness. The sublayers 610, 620, 630, 640 may respectively have the same thickness or different thicknesses.

The sublayers 610, 620, 630, 640 respectively comprise a material corresponding to the material of the matrix 310 of the optical element 300. Light-scattering particles 320 are respectively embedded in the material of the sublayers 610, 620, 630, 640. Within each sublayer 610, 620, 630, 640, the concentration of the embedded light-scattering particles 320 is essentially constant. In the first sublayer 610, the embedded light-scattering particles 320 have a first concentration. In the second sublayer 620, the embedded light-scattering particles 320 have a second concentration. In the third sublayer 630, the embedded light-scattering particles 320 have a third concentration. In the fourth sublayer 640, the embedded light-scattering particles 320 have a fourth concentration. The second concentration is greater than the first concentration. The third concentration is greater than the second concentration. The fourth concentration is greater than the third concentration.

Figure 8:
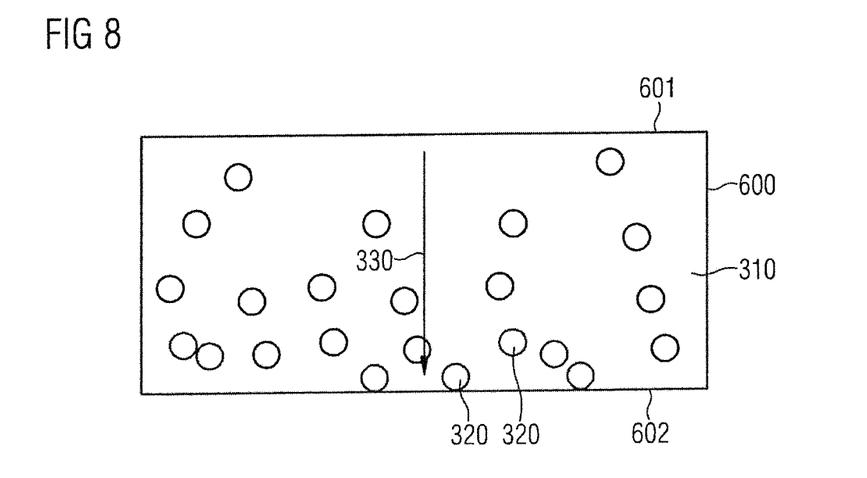
FIG. 8 shows a sectional side view of a block formed from the coextruded sublayers.

During coextrusion, the sublayers 610, 620, 630, 640 are bonded flatly to form a third block 600. In this case, an upper side of the first sublayer 610 forms an upper side 601 of the third block 600. A lower side of the fourth sublayer 640 forms a lower side 602 of the third block 600. The second sublayer 620 is arranged between the first sublayer 610 and the third sublayer 630. The third sublayer 630 is arranged between the second sublayer 620 and the fourth sublayer 640. Of course, the third block 600 could also be formed from fewer or more than four sublayers 610, 620, 630, 640.

FIG. 8 shows a schematic sectional side view of the third block 600 formed by coextrusion of the sublayers 610, 620, 630, 640. The material of the sublayers 610, 620, 630, 640 forms a matrix 310 of the third block 600. The light-scattering particles 320 are embedded in the matrix 310 of the third block 600. The concentration of the light-scattering particles 320 embedded in the matrix 310 has a concentration gradient 330. The concentration gradient 330 extends from the upper side 601 to the lower side 602 of the third block 600 and is oriented essentially perpendicularly to the upper side 601 and lower side 602 of the third block 600. Along the concentration gradient 330, the concentration of the light-scattering particles embedded in the matrix 300 of the third block 600 increases in steps.

Optical elements 300 may be formed from the third block 600 by dividing the third block 600. To this end, the third block 600 is divided in the same way as explained for the first block 400 with the aid of FIG. 4.

To produce the optical element 300, therefore, a block 400, 500, 600 in the matrix material 310 of which light-scattering particles 320 are embedded is initially formed, a concentration of the embedded light-scattering particles 320 having a concentration gradient 330. Subsequently, the block 400, 500, 600 is divided to obtain at least one optical element 300 with a lower side 302. The block 400, 500, 600 in this case is divided such that the lower side 302 of the optical element makes an angle not equal to 90° with the concentration gradient 330.

Our components, arrangements and methods have been illustrated and described in detail with the aid of preferred examples. This disclosure is nevertheless not restricted to the examples disclosed. Rather, other variants may be derived therefrom by those skilled in the art, without departing from the protective scope of the disclosure.

This application claims priority of DE 10 2013 222 702.7, the subject matter of which is incorporated herein by reference.

The invention claimed is:

1. A method of producing an optoelectronic component comprising:

producing an optical element by a method comprising:

providing a layer of a material with embedded light-scattering particles;

allowing the embedded light-scattering particles to sink in the material so that a concentration gradient is formed;

curing the material of the layer to form a block;

dividing the block to obtain an optical element with a lower side, the gradient forming an angle not equal to 90° with the lower side;

providing an optoelectronic semiconductor chip having a radiation emission face; and arranging the optical element over the radiation emission face.

2. A method of producing an optical element comprising:

forming a block of material with embedded light-scattering particles, a concentration of the embedded light-scattering particles having a gradient;

dividing the block in order to obtain an optical element with a lower side, the gradient making an angle not equal to 90° with the lower side, wherein the following steps are carried out in order to form the block:

providing a first layer of the material and a second layer of the material, the first layer having a first concentration of embedded light-scattering particles and the second layer having a second concentration of embedded light-scattering particles; and flat bonding the first layer and the second layer to form the block.

3. The method as claimed in claim 2, wherein the block is formed from more than two layers.

4. A method of producing an optoelectronic component comprising:

producing an optical element by the method as claimed in claim 2;

providing an optoelectronic semiconductor chip having a radiation emission face; and arranging the optical element over the radiation emission face.

5. A method of producing an optical element comprising:

forming a block of a material with embedded light-scattering particles, a concentration of the embedded light-scattering particles having a gradient;

dividing the block in order to obtain an optical element with a lower side, the gradient making an angle not equal to 90° with the lower side, wherein the following step is carried out in order to form the block:

coextruding a first layer of a material and a second layer of the material, the first layer having a first concentration of embedded light-scattering particles and the second layer having a second concentration of embedded light-scattering particles;

the first layer and the second layer being coextruded while lying on one another in order to form the block.

6. The method as claimed in claim 5, wherein the block is formed from more than two layers.

7. A method of producing an optoelectronic component comprising:

producing an optical element by the method as claimed in claim 5;

providing an optoelectronic semiconductor chip having a radiation emission face; and arranging the optical element over the radiation emission face.

* * * * *